| (12) | United States Patent | (10) Patent No.: | US 11,502,069 B2 |
|---|---|---|---|
| | Jung et al. | (45) Date of Patent: | Nov. 15, 2022 |

(54) STRETCHABLE DISPLAY DEVICE

(71) Applicant: LG Display Co., Ltd., Seoul (KR)

(72) Inventors: Hyunju Jung, Seoul (KR); Eunah Kim, Seosan-si (KR)

(73) Assignee: LG Display Co., Ltd., Seoul (KR)

( * ) Notice: Subject to any disclaimer, the term of this patent is extended or adjusted under 35 U.S.C. 154(b) by 153 days.

(21) Appl. No.: 16/998,663

(22) Filed: Aug. 20, 2020

(65) Prior Publication Data

US 2021/0066266 A1 Mar. 4, 2021

(30) Foreign Application Priority Data

Aug. 27, 2019 (KR) .......................... 10-2019-0105438

(51) Int. Cl.
*H01L 25/16* (2006.01)
*H01L 51/00* (2006.01)
*H01L 25/075* (2006.01)
*H01L 27/15* (2006.01)

(52) U.S. Cl.
CPC ........ *H01L 25/165* (2013.01); *H01L 25/0753* (2013.01); *H01L 25/162* (2013.01); *H01L 25/167* (2013.01); *H01L 27/156* (2013.01); *H01L 51/0097* (2013.01)

(58) Field of Classification Search
CPC ... H01L 25/165; H01L 25/162; H01L 25/167; H01L 25/0753; H01L 27/156; H01L 51/0097; H01L 2251/5338; Y02E 10/549; G09F 9/301; G06F 1/1652; G06F 2203/04102
See application file for complete search history.

(56) References Cited

U.S. PATENT DOCUMENTS

| 2005/0140265 | A1* | 6/2005 | Hirakata | ............. H01L 51/5259 |
|---|---|---|---|---|
| | | | | 313/484 |
| 2007/0218411 | A1* | 9/2007 | Sakata | .................. G06F 1/1601 |
| | | | | 313/582 |
| 2010/0002402 | A1* | 1/2010 | Rogers | ................... H05K 1/028 |
| | | | | 361/749 |
| 2011/0205183 | A1* | 8/2011 | Sugihara | ................ H05K 3/361 |
| | | | | 178/18.05 |
| 2016/0085110 | A1 | 3/2016 | Shin et al. | |
| 2017/0005077 | A1* | 1/2017 | Kim | ...................... G06F 1/1643 |
| 2017/0288168 | A1* | 10/2017 | Kim | ...................... H01L 27/3258 |
| 2018/0046221 | A1* | 2/2018 | Choi | .................. G02B 26/0825 |
| 2018/0088736 | A1* | 3/2018 | Jeong | .................. G06F 3/04144 |
| 2018/0190672 | A1* | 7/2018 | Lee | ........................ H01L 27/124 |

(Continued)

FOREIGN PATENT DOCUMENTS

| CN | 106098951 A | 11/2016 |
|---|---|---|
| CN | 109427862 A | 3/2019 |
| KR | 10-2017-0027222 A | 3/2017 |

*Primary Examiner* — Ahmed N Sefer
(74) *Attorney, Agent, or Firm* — Seed IP Law Group LLP

(57) ABSTRACT

A stretchable display device includes a substrate structure which has a display area where images are displayed and a non-display area adjacent to the display area and includes an upper stretching substrate and a lower stretching substrate; and a frame which is disposed to cover a first side surface and a second side surface opposite to the first side surface, among a plurality of side surfaces of the substrate structure, in which a modulus of the frame is higher than moduli of the upper stretching substrate and the lower stretching substrate.

15 Claims, 6 Drawing Sheets

(56) References Cited

U.S. PATENT DOCUMENTS

| | | | |
|---|---|---|---|
| 2020/0027945 A1* | 1/2020 | Kim | H01L 27/3246 |
| 2020/0043991 A1* | 2/2020 | Noh | H04R 7/04 |
| 2020/0275561 A1* | 8/2020 | Park | H05K 5/0017 |
| 2021/0135133 A1* | 5/2021 | Zhu | G09G 3/3225 |

* cited by examiner

STRETCHABLE DISPLAY DEVICE

CROSS-REFERENCE TO RELATED APPLICATION

This application claims the priority of Korean Patent Application No. 10-2019-0105438 filed on Aug. 27, 2019, in the Korean Intellectual Property Office, the disclosure of which is incorporated herein by reference.

BACKGROUND

Technical Field

The present disclosure relates to a stretchable display device, and more particularly to a stretchable display device which reduces contraction of a display panel when the stretchable display device is stretched.

Description of the Related Art

As display devices which are used for a monitor of a computer, a television, or a cellular phone, there are an organic light emitting display device (OLED) which is a self-emitting device, a liquid crystal display device (LCD) which requires a separate light source, and the like.

An applicable range of the display device is diversified to personal digital assistants as well as monitors of computers and televisions and a display device with a large display area and a reduced volume and weight is being studied.

Recently, a stretchable display device which is manufactured by forming a display unit and a wiring line on a flexible substrate such as plastic which is a flexible material so as to be stretchable in a specific direction and changed in various forms is getting attention as a next generation display device.

BRIEF SUMMARY

The inventors of the present disclosure has developed a stretchable display device that provides the following technical improvements.

The present disclosure provides a stretchable display device which reduces contraction of a stretching substrate when the stretchable display device is stretched.

The present disclosure provides a stretchable display device which reduces reflectance at an outer peripheral portion of a stretching substrate.

The present disclosure provides a stretchable display device which reduces a stress generated between a stretching substrate and a frame when the stretchable display device is stretched.

The present disclosure provides a stretchable display device which improves an adhesiveness between a substrate and a frame.

The present disclosure provides a stretchable display device which improves a reliability of a display panel.

The technical benefits of the present disclosure are not limited to the above-mentioned benefits, and other benefits or improvements, which are not mentioned above, can be clearly understood by those skilled in the art from the following descriptions.

In one or more embodiments of the present disclosure, a stretchable display device includes a substrate structure which defines a display area where images are displayed and a non-display area adjacent to the display area and includes an upper stretching substrate and a lower stretching substrate; and a frame which is disposed to cover a first side surface and a second side surface opposite to the first side surface, among a plurality of side surfaces of the substrate structure, in which a modulus of the frame is higher than moduli of the upper stretching substrate and the lower stretching substrate.

According to another aspect of the present disclosure, a stretchable display device includes a stretching substrate structure which defines a display area in which a plurality of pixels is defined and a non-display area disposed to enclose the display area and includes a first stretching substrate and a second stretching substrate; and a frame which is disposed to be in contact with at least one of a top surface, a bottom surface, and a side surface of the stretching substrate structure, the frame may have a rigidity higher than that of the first stretching substrate and the second stretching substrate.

Other detailed matters of the embodiments are included in the detailed description and the drawings.

According to the present disclosure, a frame having a modulus higher than that of the stretching substrate is disposed in a part of the substrate so that when the stretchable display device is stretched, the damage of the display panel and the connection line due to the contraction may be reduced.

According to the present disclosure, the pigment is dispersed in the frame to reduce the reflection at an outer peripheral portion of the stretching substrate.

According to the present disclosure, an adhesive material is disposed between the substrate and the structure to improve the adhesiveness between the substrate and the frame.

According to the present disclosure, the frame is configured by a plurality of layers so that when the stretchable display device is stretched, a stress generated in the stretching substrate may be reduced.

According to the present disclosure, moisture which flows into the stretching substrate is reduced to improve the reliability of the display panel.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
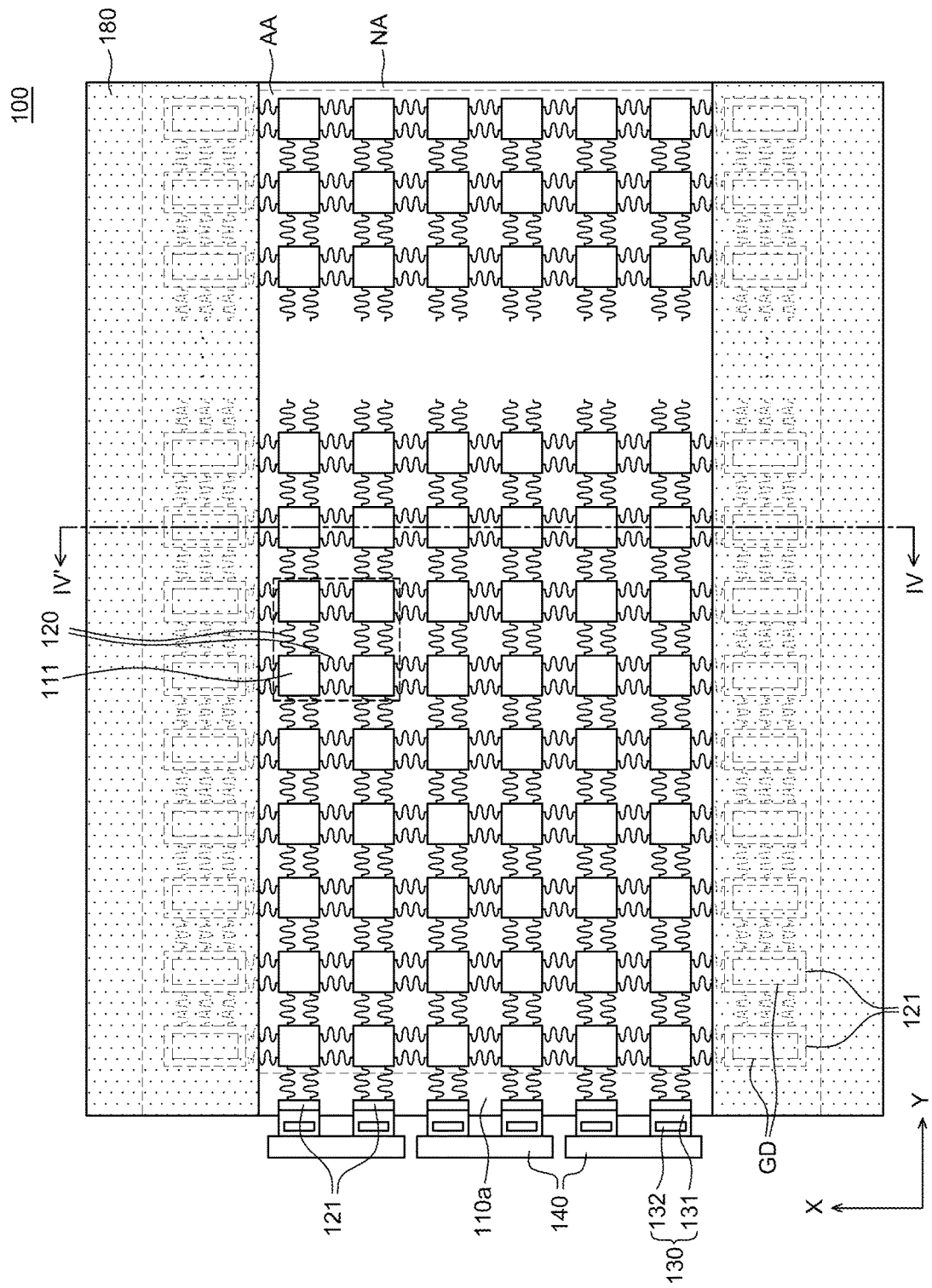
FIG. 1 is a plan view of a stretchable display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to embodiments of the present disclosure will be described in detail with reference to accompanying drawings.

Stretchable Display Device

A stretchable display device may be referred to as a display device which is capable of displaying images even though the display device is bent or extended. The stretchable display device may have a high flexibility as compared with a general display device of the related art. Therefore, a shape of a stretchable display device may be freely changed in accordance with manipulation of a user to bend or extend a stretchable display device. For example, when the user holds ends of the stretchable display device to pull the stretchable display device, the stretchable display device may be extended by the force of the user. Alternatively, when the user disposes the stretchable display device on a wall surface which is not flat, the stretchable display device may be disposed to be bent in accordance with the shape of the surface of the wall. Further, when a force applied by the user is removed, the stretchable display device may return to its original shape.

Various applications have been filed by the current applicant describing the basic structure and operation of a stretchable display, among them are U.S. patent application Ser. No. 16/712,256 by JiYoung Ahn et al. filed on Dec. 12, 2019 and U.S. patent application Ser. No. 16/588,371 by Seulki KIM et al. filed on Sep. 30, 2019, each of which is incorporated herein by reference.

Figure 2:
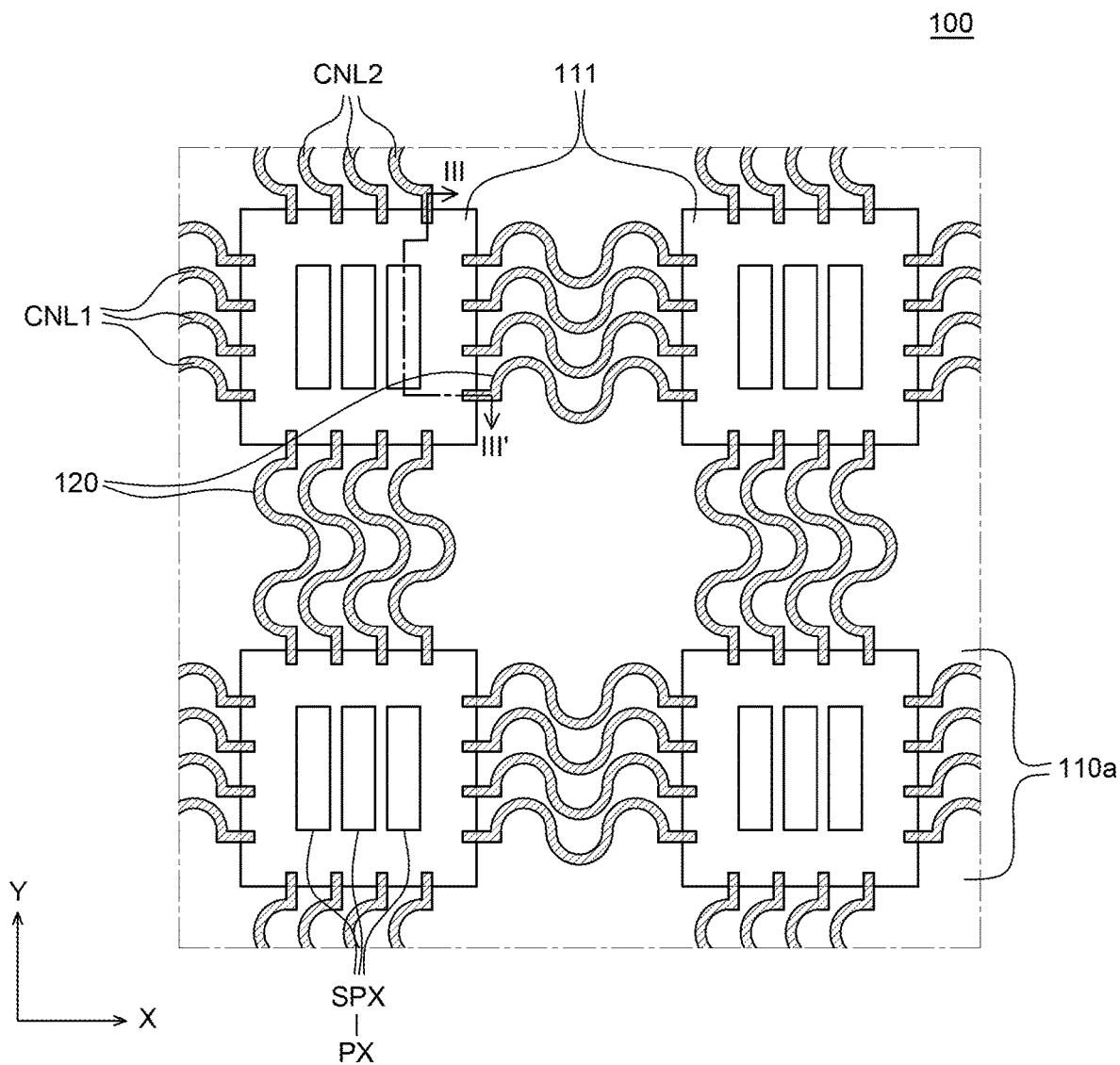
FIG. 2 is an enlarged plan view of a stretchable display device according to an embodiment of the present disclosure.
Figure 3:
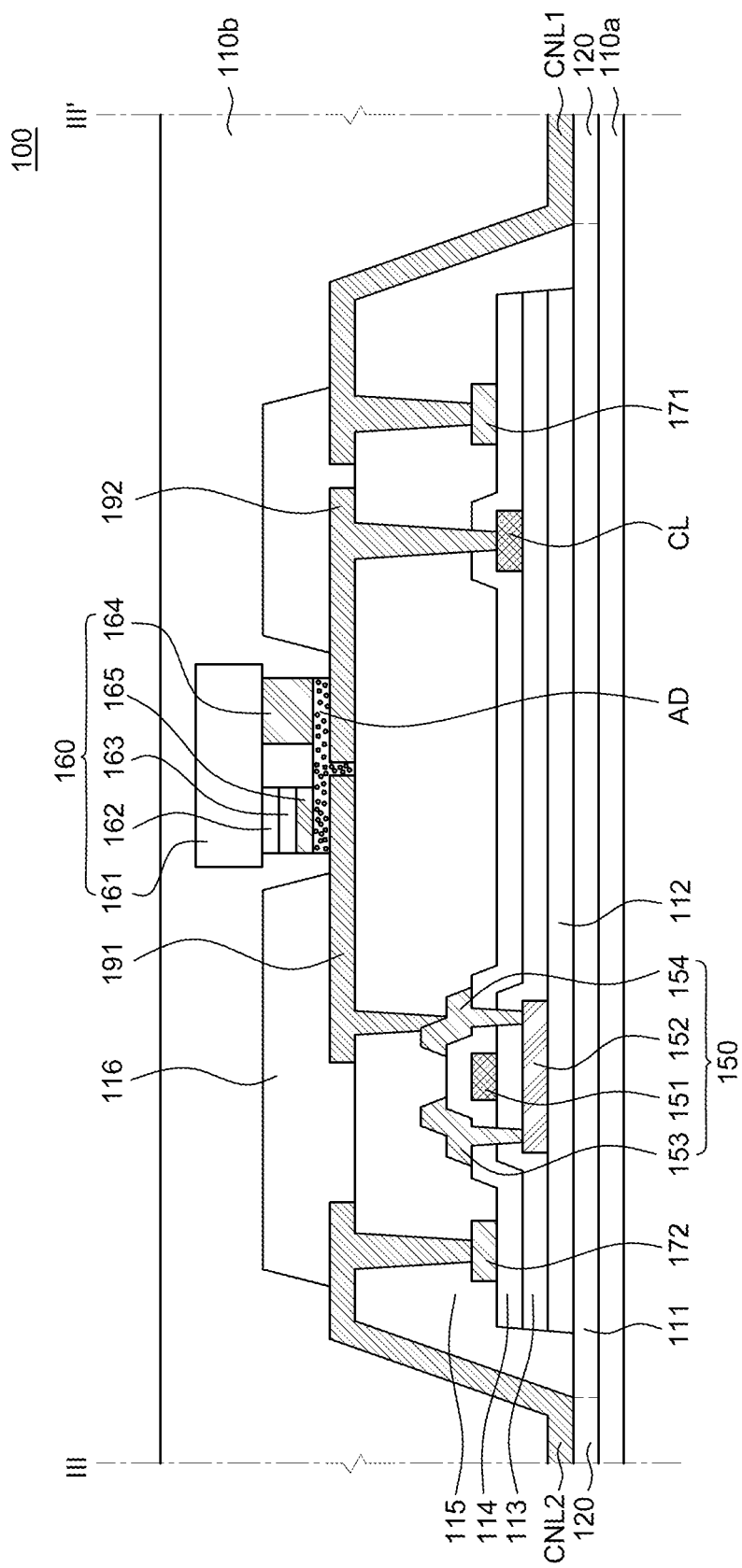
FIG. 3 is a cross-sectional view taken along the line of FIG. 2.

FIG. 1 is a schematic plan view of a stretchable display device according to an embodiment of the present disclosure. FIG. 2 is an enlarged plan view of a stretchable display device according to an embodiment of the present disclosure. FIG. 3 is a cross-sectional view taken along the line of FIG. 2.

Referring to FIG. 1, a stretchable display device 100 includes a lower stretching substrate 110a, a plurality of first substrates 111, a plurality of second substrates 120, a plurality of third substrates 121, a chip on film (COF) 130, a printed circuit board 140, and a frame 180.

The lower stretching substrate 110a is a substrate which supports and protects various components of the stretchable display device 100 and is referred to as a first stretching substrate. The lower stretching substrate 110a which is a soft substrate may be configured by an insulating material which is bendable or extendable. For example, the lower stretching substrate 110a may be formed of a silicon rubber such as polydimethylsiloxane (PDMS) or an elastomer such as polyurethane (PU) or polytetrafluoroethylene (PTFE) and thus have a flexible property. The stretching substrate used herein includes stretchable substrates that are configured to be extendable, contractible, pliable, flexible, or bendable. However, the material of the lower stretching substrate 110a is not limited thereto.

The lower stretching substrate 110a is a soft substrate so as to be reversibly expanded and contracted. Further, an elastic modulus of the lower stretching substrate 110a may be several MPa to several hundreds of MPa, for example, may be 0.7 MPa to 1 MPa. Further, an extension rupture rate of the lower stretching substrate 110a may be 100% or higher. Here, the extension rupture rate refers to an extension rate at a timing when an object to be stretched is broken or cracked. A thickness of the lower stretching substrate 110a may be 10 μm to 1 mm but is not limited thereto.

Referring to FIGS. 1 to 3, the above-described lower stretching substrate 110a and an upper stretching substrate 110b are included to be referred to as a substrate structure 110. To be more specific, the substrate structure 110 including the lower stretching substrate 110a and the upper stretching substrate 110b may be referred to as a stretching substrate structure.

In the meantime, the substrate structure 110 including the lower stretching substrate 110a and the upper stretching substrate 110b may have a display area AA and a non-display area NA which encloses the display area AA.

The display area AA is an area in which an image is displayed in the stretchable display device 100 and a display element and various driving elements for driving the display element are disposed in the display area AA. The display area AA may include a plurality of pixels including a plurality of sub pixels. The plurality of pixels is disposed in the display area AA and includes a plurality of display elements. The plurality of sub pixels may be connected to various wiring lines, respectively. For example, each of the plurality of sub pixels may be connected to various wiring lines such as a gate line, a data line, a high potential power source line, a low potential power source line, and a reference voltage line.

The non-display area NA is adjacent to the display area AA. The non-display area NA is adjacent to the display area AA to enclose the display area AA. In the non-display area NA, no image is displayed and wiring lines and circuit units may be formed. For example, in the non-display area NA, a plurality of pads is disposed, and the pads may be connected to the plurality of sub pixels of the display areas AA, respectively.

A plurality of first substrates 111 and a plurality of third substrates 121 are disposed on the lower stretching substrate 110*a*. The plurality of first substrates 111 may be disposed in the display area AA of the lower stretching substrate 110*a* and the plurality of third substrates 121 may be disposed in the non-display area NA of the lower stretching substrate 110*a*. Even though in FIG. 1, it is illustrated that the plurality of third substrates 121 is disposed at an upper side, a lower side, and a left side of the display area AA in the non-display area NA, it is not limited thereto and may be disposed in an arbitrary area of the non-display area NA.

The plurality of first substrates 111 and the plurality of third substrates 121 are rigid substrates and are spaced apart from each other to be independently disposed on the lower stretching substrate 110*a*. The plurality of first substrates 111 and the plurality of third substrates 121 may be rigider than the lower stretching substrate 110*a*. That is, the lower stretching substrate 110*a* may have a soft characteristic more than the plurality of first substrates 111 and the plurality of third substrates 121 and the plurality of first substrates 111 and the plurality of third substrates 121 have a rigid characteristic more than the lower stretching substrate 110*a*.

The plurality of first substrates 111 and the plurality of third substrates 121 which are a plurality of rigid substrates may be formed of a plastic material having flexibility and for example, may be formed of polyimide (PI), polyacrylate, or polyacetate. However, they are not limited thereto and may be formed of a different material. In this case, the plurality of first substrates 111 and the plurality of third substrates 121 may be formed of the same or substantially the same material but are not limited thereto and may be formed of different materials.

Moduli of the plurality of first substrates 111 and the plurality of third substrates 121 may be higher than that of the lower stretching substrate 110*a*. The modulus is an elastic modulus which represents a ratio being deformed by a stress with respect to a stress applied to the substrate. The higher the modulus, the higher a degree of hardness. Therefore, the plurality of first substrates 111 and the plurality of third substrates 121 may be a plurality of rigid substrates having rigidity as compared with the lower stretching substrate 110*a*. The moduli of the plurality of first substrates 111 and the plurality of third substrates 121 may be 1000 or more times higher than the modulus of the lower stretching substrate 110*a* but are not limited thereto.

In some embodiments, the lower stretching substrate 110*a* may be defined to include a plurality of first lower patterns and second lower patterns. The plurality of first lower patterns is disposed in an area of the lower stretching substrate 110*a* overlapping the plurality of first substrates 111 and the plurality of third substrates 121. The second lower patterns may be disposed in an area excluding an area where the plurality of first substrates 111 and the plurality of third substrates 121 are disposed or disposed in the entire stretchable display device 100.

In this case, moduli of the plurality of first lower patterns may be higher than moduli of the second lower patterns. For example, the plurality of first lower patterns may be formed of the same or substantially the same material as the plurality of first substrates 111 and the second lower pattern may be formed of a material having a modulus lower than that of the plurality of first substrates 111.

The COF 130 is a flexible film on which various components are disposed on a base film 131 having a flexibility and supplies signals to the plurality of sub pixels of the display area AA. The COF 130 may be bonded to the plurality of pads disposed in the non-display area NA and supply a power voltage, a data voltage, and a gate voltage to the plurality of sub pixels of the display area AA through the pads. The COF 130 includes the base film 131 and a driving IC 132. Further, various components may be additionally disposed thereon.

The base film 131 is a layer which supports the driving IC 132 of the COF 130. The base film 131 may be formed of an insulating material, and for example, may be formed of an insulating material having a flexibility.

The driving IC 132 is a component which processes data for displaying images and a driving signal for processing the data. In FIG. 1, even though it is illustrated that the driving IC 132 is mounted by the COF 130 technique, it is not limited thereto, and the driving IC 132 may be mounted by chip on glass (COG) or tape carrier package (TCP).

In FIG. 1, one third substrate 121 is disposed in the non-display area NA at the left side of the display area AA so as to correspond to one row of the first substrates 111 disposed in the display area AA, and one COF 130 is disposed for one third substrate 121, but is not limited thereto. That is, one third substrate 121 and one COF 130 may be disposed so as to correspond to a plurality of rows of the first substrates 111.

A control unit such as an IC chip or a circuit unit may be mounted on the printed circuit board 140. Further, on the printed circuit board 140, a memory or a processor may be mounted. The printed circuit board 140 is a component which transmits a signal for driving the display element from the control unit to the display element. Even though in FIG. 1, it is described that three printed circuit boards 140 are used, the number of printed circuit boards 140 is not limited thereto.

The upper stretching substrate 110*b* is a substrate which overlaps the lower stretching substrate 110*a* to support various components of the stretchable display device 100 and is referred to as a second stretching substrate. The upper stretching substrate 110*b* which is a soft substrate may be configured by an insulating material which is bendable or extendable. For example, the upper stretching substrate 110*b* may be formed of a flexible material and formed of the same or substantially the same material as the lower stretching substrate 110*a* but is not limited thereto.

The frame 180 is disposed to cover a first side surface among a plurality of side surfaces of the substrate structure 110 and a second side surface which is opposite to the first side surface. For example, as illustrated in FIG. 1, the frame 180 may be disposed on both side surfaces of the substrate structure 110 with respect to an X-axis direction. Further, the frame 180 may extend in a Y-axis direction. The frame 180 may be disposed in the non-display area AA where the third substrate 121 is disposed. However, even though in FIG. 1, it is illustrated that the frame 180 covers all the third substrates 121 in the non-display area AA, it is not limited thereto. Therefore, the frame 180 may be disposed to cover a part of the non-display area AA depending on the necessity for design.

In the meantime, the frame 180 has a modulus higher than that of the substrate structure 110. That is, the frame 180 has a higher rigidity than that of the substrate structure 110. Therefore, when the stretchable display device 100 is stretched, the frame 180 may reduce contraction generated in a direction perpendicular to a stretching direction of the substrate structure 110. The frame 180 will be described below in more detail with reference to FIG. 4.

Hereinafter, the stretchable display device 100 according to the embodiment of the present disclosure will be described in more detail with reference to FIGS. 2 and 3.

Planar and Cross-Sectional Structures

Referring to FIGS. 1 and 2, the plurality of first substrates 111 is disposed on the lower stretching substrate 110a in the display area AA. The plurality of first substrates 111 is spaced apart from each other to be disposed on the lower stretching substrate 110a. For example, as illustrated in FIGS. 1 and 2, the plurality of first substrates 111 may be disposed on the lower stretching substrate 110a in a matrix but is not limited thereto.

Referring to FIGS. 1 and 2, a plurality of sub pixels SPX which configures the plurality of pixels PX is disposed on the plurality of first substrates 111 and a gate driver GD may be mounted on a third substrate 121 located at a left side of the display area AA, among the plurality of third substrates 121. The gate driver GD may be formed on the third substrate 121 in a gate in panel (GIP) manner when various elements on the first substrate 111 are manufactured. Therefore, various circuit configurations which configure the gate driver GD, such as various transistors, capacitors, and wiring lines, may be disposed on the plurality of third substrates 121. However, it is not limited thereto, and the gate driver GD may be mounted in a chip on film (COF) manner. Further, the plurality of third substrates 121 may also be disposed in the non-display area NA located at a right side of the display area AA, and the gate driver GD may also be mounted in the plurality of third substrates 121 located at the right side of the display area AA.

Referring to FIG. 1, sizes of the plurality of third substrates 121 may be larger than sizes of the plurality of first substrates 111. Specifically, a size of each of the plurality of third substrates 121 may be larger than a size of each of the plurality of first substrates 111. As described above, on each of the plurality of third substrates 121, the gate driver GD is disposed. For example, one stage of the gate driver GD may be disposed on each of the plurality of third substrates 121. Therefore, an area occupied by various circuit configurations which configure one stage of the gate driver GD may be relatively larger than an area of the first substrate 111 on which the pixel PX is disposed. As a result, a size of each of the plurality of third substrates 121 may be larger than a size of each of the plurality of first substrates 111.

Referring to FIGS. 1 and 2, the plurality of second substrates 120 may be disposed between the plurality of first substrates 111, between the plurality of third substrates 121, or between the plurality of first substrates 111 and the plurality of third substrates 121. The plurality of second substrates 120 is substrates which connect adjacent first substrates 111, adjacent third substrates 121, or between the first substrate 111 and the third substrate 121 and may be referred to as connection substrates. The plurality of second substrates 120 may be simultaneously and integrally formed with the same or substantially the same material as the first substrates 111 or the third substrate 121 but is not limited thereto.

Referring to FIG. 2, the plurality of second substrates 120 has a wavy shape. For example, as illustrated in FIG. 2, the plurality of second substrates 120 may have a sine wave shape. However, the shape of the plurality of second substrates 120 is not limited thereto and the plurality of second substrates 120 may extend with a zigzag pattern or may be formed with various shapes such as a shape extended by connecting a plurality of rhombus-shaped substrates at vertexes. Further, the number and the shape of the plurality of second substrates 120 illustrated in FIG. 2 are illustrative and the number and the shape of the plurality of second substrates 120 may vary depending on the design.

Referring to FIG. 3, a plurality of inorganic insulating layers is disposed on the plurality of first substrates 111. For example, the plurality of inorganic insulating layers may include a buffer layer 112, a gate insulating layer 113, and an interlayer insulating layer 114, but is not limited thereto. Therefore, various inorganic insulating layers may be additionally disposed on the plurality of first substrates 111 or one or more of the buffer layer 112, the gate insulating layer 113, and the interlayer insulating layer 114 may be omitted.

Referring to FIG. 3, the buffer layer 112 is disposed on the plurality of first substrates 111. The buffer layer 112 is formed on the plurality of first substrates 111 to protect various components of the stretchable display device 100 from permeation of moisture ($H_2O$) and oxygen ($O_2$) from the outside of the lower stretching substrate 110a and the plurality of first substrates 111. The buffer layer 112 may be configured of an insulating material and for example, configured by a single layer or a double layer of an inorganic layer formed of silicon nitride (SiNx), silicon oxide (SiOx), and silicon oxynitride (SiON). However, the buffer layer 112 may be omitted depending on a structure or a characteristic of the stretchable display device 100.

In this case, the buffer layer 112 may be formed only in an area overlapping the plurality of first substrates 111 and the plurality of third substrates 121. As described above, the buffer layer 112 may be formed of an inorganic material so that the buffer layer 112 may be easily cracked or damaged during a process of stretching the stretchable display device 100. Therefore, the buffer layer 112 is not formed in an area between the plurality of first substrates 111 and the plurality of third substrates 121, but is patterned to have a shape of the plurality of first substrates 111 and the plurality of third substrates 121 to be disposed only above the plurality of first substrates 111 and the plurality of third substrates 121. Therefore, in the stretchable display device 100 according to the embodiment of the present disclosure, the buffer layer 112 is formed only in an area overlapping the plurality of first substrates 111 and the plurality of third substrates 121 which are rigid substrates. Therefore, even though the stretchable display device 100 is bent or stretched to be deformed, the damage of the buffer layer 112 may be suppressed.

Referring to FIG. 3, the transistor 150 including a gate electrode 151, an active layer 152, a source electrode 153, and a drain electrode 154 is formed on the buffer layer 112.

First, referring to FIG. 3, the active layer 152 is disposed on the buffer layer 112. For example, the active layer 152 may be formed of an oxide semiconductor, amorphous silicon (a-Si), polycrystalline silicon (poly-Si), or an organic semiconductor.

A gate insulating layer 113 is disposed on the active layer 152. The gate insulating layer 113 is a layer for electrically insulating the gate electrode 151 from the active layer 152 and may be formed of an insulating material. For example, the gate insulating layer 113 may be formed as a single layer of silicon nitride (SiNx) or silicon oxide (SiOx) which is an inorganic material or a multiple layer of silicon nitride (SiNx) or silicon oxide (SiOx), but it is not limited thereto.

The gate electrode 151 is disposed on the buffer layer 112. The gate electrode 151 is disposed to overlap the active layer 152. The gate electrode 151 may be any one of various metal materials, for example, molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The interlayer insulating layer 114 is disposed on the gate electrode 151. The interlayer insulating layer 114 is a layer which insulates the gate electrode 151 from the source electrode 153 and the drain electrode 154 and is formed of an inorganic material, similarly to the buffer layer 112. For example, the interlayer insulating layer 114 may be formed as a single layer of silicon nitride (SiNx) or silicon oxide (SiOx) which is an inorganic material or a multiple layer of silicon nitride (SiNx) or silicon oxide (SiOx), but it is not limited thereto.

The source electrode 153 and the drain electrode 154 which are in contact with the active layer 152 are disposed on the interlayer insulating layer 114. The source electrode 153 and the drain electrode 154 are disposed on the same layer to be spaced apart from each other. The source electrode 153 and the drain electrode 154 may be in contact with the active layer 152 to be electrically connected to the active layer 152. The source electrode 153 and the drain electrode 154 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The gate insulating layer 113 and the interlayer insulating layer 114 are patterned to be formed only in an area overlapping the plurality of first substrates 111. The gate insulating layer 113 and the interlayer insulating layer 114 are also formed of the inorganic material, similarly to the buffer layer 112, so that the gate insulating layer 113 and the interlayer insulating layer 114 may also be easily cracked to be damaged during the process of stretching the stretchable display device 100. Therefore, the gate insulating layer 113 and the interlayer insulating layer 114 are not formed in an area between the plurality of first substrates 111 but are patterned to have a shape of the plurality of first substrates 111 to be formed only above the plurality of first substrates 111.

In FIG. 3, even though among various transistors which may be included in the stretchable display device 100, only a driving transistor is illustrated for the convenience of description, a switching transistor or a capacitor may also be included in the display device. Further, in this specification, even though it is described that the transistor 150 has a coplanar structure, various transistors such as a staggered transistor may also be used.

Referring to FIG. 3, a plurality of pads 170 is disposed on the interlayer insulating layer 114. Specifically, a gate pad 171 among the plurality of pads 170 is disposed on the interlayer insulating layer 114. The gate pad 171 is a pad which transmits a gate signal to the plurality of sub pixels SPX. The gate signal may be transmitted to the gate electrode 151 from the gate pad 171 through a gate line formed on the first substrate 111. The gate pad 171 may be formed of the same or substantially the same material as the source electrode 153 and the drain electrode 154 but is not limited thereto.

Referring to FIG. 3, a data pad 172 among the plurality of pads 170 is disposed on the interlayer insulating layer 114. The data pad 172 is a pad which transmits a data signal to the plurality of sub pixels SPX. The data signal may be transmitted to the source electrode 153 or the drain electrode 154 from the data pad 172 through a data line formed on the first substrate 111. The data pad 172 may be formed of the same or substantially the same material as the source electrode 153 and the drain electrode 154 but is not limited thereto.

Referring to FIG. 3, a planarization layer 115 is formed on the transistor 150 and the interlayer insulating layer 114. The planarization layer 115 planarizes an upper portion of the transistor 150. The planarization layer 115 may be configured by a single layer or a plurality of layers and may be formed of an organic material. Therefore, the planarization layer 115 may also be referred to as an organic insulating layer. For example, the planarization layer 115 may be formed of an acrylic organic material but is not limited thereto.

Referring to FIG. 3, the planarization layer 115 is disposed on the plurality of first substrates 111 to cover top surfaces and side surfaces of the buffer layer 112, the gate insulating layer 113, and the interlayer insulating layer 114. The planarization layer 115 may be disposed to enclose the buffer layer 112, the gate insulating layer 113, and the interlayer insulating layer 114 together with the plurality of first substrates 111. Specifically, the planarization layer 115 may be disposed so as to cover a top surface and a side surface of the interlayer insulating layer 114, a side surface of the gate insulating layer 113, a side surface of the buffer layer 112, and a part of a top surface of the plurality of first substrates 111. Therefore, the planarization layer 115 may compensate for a step on the side surfaces of the buffer layer 112, the gate insulating layer 113, and the interlayer insulating layer 114 and enhance an adhesive strength of the planarization layer 115 and a connection line CNL disposed on the side surface of the planarization layer 115.

Referring to FIG. 3, an inclination angle of the side surface of the planarization layer 115 may be smaller than an inclination angle formed by side surfaces of the buffer layer 112, the gate insulating layer 113, and the interlayer insulating layer 114. For example, the side surface of the planarization layer 115 may have a slope which is gentler than a slope formed by a side surface of the interlayer insulating layer 114, a side surface of the gate insulating layer 113, and a side surface of the buffer layer 112. Therefore, the connection line CNL which is disposed to be in contact with the side surface of the planarization layer 115 is disposed with a gentle slope so that when the stretchable display device 100 is stretched, a stress generated in the connection line CNL is reduced. Further, the crack occurring in the connection line CNL or a separation from the side surface of the planarization layer 115 may be suppressed.

In some embodiments, a passivation layer may be formed between the transistor 150 and the planarization layer 115.

That is, the passivation layer may be formed to cover the transistor 150 to protect the transistor 150 from the permeation of the moisture and oxygen. The passivation layer may be formed of an inorganic material and configured by a single layer or a plurality of layers but is not limited thereto.

Referring to FIG. 3, a common line CL is disposed on the gate insulating layer 113. The common line CL is a wiring line which applies a common voltage to the plurality of sub pixels SPX. The common line CL may be formed of the same or substantially the same material as the gate electrode 151 of the transistor 150 but is not limited thereto.

Referring to FIGS. 2 and 3, the connection line CNL refers to a wiring line which electrically connects pads on the plurality of first substrates 111 or the plurality of third substrates 121. The connection line CNL is disposed on the first substrates 111 and the plurality of second substrates 120.

The connection line CNL includes a first connection line CNL1 and a second connection line CNL2. The first connection line CNL1 and the second connection line CNL2 are disposed between the plurality of first substrates 111. Specifically, the first connection line CNL1 refers to a wiring line extending in the X-axis direction between the plurality of first substrates 111, among the connection lines CNL. The second connection line CNL2 refers to a wiring line extending in the Y-axis direction between the plurality of first substrates 111, among the connection lines CNL.

The connection line CNL may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti), but is not limited thereto.

In the case of a general organic light emitting display device, various wiring lines such as a plurality of gate lines and a plurality of data lines extend between the plurality of sub pixels with a straight line shape and the plurality of sub pixels is connected to one signal line. Therefore, in the general organic light emitting display device, various wiring lines, such as a gate line, a data line, a high potential power source line, and a reference voltage line, extend from one side to the other side of the organic light emitting display device without being disconnected on the substrate.

In contrast, in the stretchable display device 100 according to the embodiment of the present disclosure, various wiring lines such as a gate line, a data line, a high potential power source line, or a reference voltage line having a straight line shape which are considered to be used for the general organic light emitting display device may be disposed only on the plurality of first substrates 111 and the plurality of third substrates 121. That is, in the stretchable display device 100 according to the embodiment of the present disclosure, a straight wiring line is disposed only on the plurality of first substrates 111 and the plurality of third substrates 121.

In the stretchable display device 100 according to the embodiment of the present disclosure, in order to connect discontinuous wiring lines on the first substrate 111 or the third substrate 121, pads on two adjacent first substrates 111 or two adjacent third substrates 121 may be connected by the connection line CNL. That is, the connection line CNL electrically connects pads on two adjacent first substrates 111, on two third substrates 121, and on the first substrate 111 and the third substrate 121. Accordingly, the stretchable display device 100 according to the embodiment of the present disclosure may include a plurality of connection lines CNL which electrically connects various wiring lines, such as a gate line, a data line, a high potential power source line, and a reference voltage line, between the plurality of first substrates 111, between the plurality of third substrates 121, and between the plurality of first substrates 111 and the plurality of third substrates 121. For example, the gate line may be disposed on the plurality of first substrates 111 disposed to be adjacent to each other in the X-axis direction and the gate pad 171 may be disposed on both ends of the gate line. In this case, the plurality of gate pads 171 on the plurality of first substrates 111 adjacent to each other in the X-axis direction may be connected to each other by the first connection line CNL1 which serves as a gate line. Therefore, the gate line disposed on the plurality of first substrates 111 and the first connection line CNL1 disposed on the third substrate 121 may serve as one gate line. Further, wiring lines which extend in the X-axis direction, among all various wiring lines which may be included in the stretchable display device 100 such as an emission signal line, a low potential power source line, and a high potential power source line, may also be electrically connected by the first connection line CNL1, as described above.

Referring to FIGS. 2 and 3, the first connection line CNL1 may connect pads on two first substrates 111 which are disposed side by side among the pads on the plurality of first substrates 111 which is disposed to be adjacent to each other in the X-axis direction. The first connection line CNL1 may serve as a gate line, an emission signal line, a high potential power source line, or a low potential power source line, but is not limited thereto. For example, the first connection line CNL1 may serve as a gate line and electrically connect the gate pads 171 on two first substrates 111 which are disposed side by side in the X-axis direction. Therefore, as described above, the gate pads 171 on the plurality of first substrates 111 disposed in the X-axis direction may be connected by the first connection line CNL1 serving as a gate line and transmit one gate signal.

Referring to FIG. 2, the second connection line CNL2 may connect pads on two first substrates 111 which are disposed side by side among the pads on the plurality of first substrates 111 which is disposed to be adjacent to each other in the Y-axis direction. The second connection line CNL2 may serve as a data line, a high potential power source line, a low potential power source line, or a reference voltage line, but is not limited thereto. For example, the second connection line CNL2 may serve as a data line and electrically connect the data lines DL on two first substrates 111 which are disposed side by side in the Y-axis direction. Therefore, as described above, the data line DL on the plurality of first substrates 111 disposed in the Y-axis direction may be connected by the plurality of second connection lines CNL2 serving as data lines and transmit one data signal.

Referring to FIG. 1, the connection line CNL may further include a wiring line which connects pads on the plurality of first substrates 111 and the plurality of third substrates 121 or connects pads on two third substrates 121 disposed side by side, among pads on the plurality of third substrates 121 disposed to be adjacent to each other in the Y-axis direction.

The first connection line CNL1 is formed to extend to a top surface of the second substrate 120 while being in contact with a top surface and a side surface of the planarization layer 115 disposed on the first substrate 111. Further, the second connection line CNL2 is formed to extend to a top surface of the second substrate 120 while being in contact with a top surface and a side surface of the planarization layer 115 disposed on the first substrate 111. The arrangement and the effects of the first connection line CNL1 and the second connection line CNL2 will be described below in more detail.

Referring to FIG. 3, a bank 116 is formed on the first connection pad 191, the second connection pad 192, the connection line CNL, and the planarization layer 115. The bank 116 is a component which divides adjacent sub pixels SPX.

The bank 116 is disposed so as to cover a part of the second connection line CNL2 and the first connection pad 191 which are adjacent to each other or at least a part of the first connection line CNL1 and the second connection pad 192. The bank 116 may be formed of an insulating material. Further, the bank 116 may include a black material. The bank 116 includes the black material to block wiring lines which may be visible through the display area AA. For example, the bank 116 may be formed of a transparent carbon-based mixture and specifically and include carbon black. However, it is not limited thereto and the bank 116 may be formed of a transparent insulating material.

Referring to FIG. 3, the LED 160 is disposed on the first connection pad 191 and the second connection pad 192. The LED 160 includes an n-type layer 161, an active layer 162, a p-type layer 163, an n electrode 164, and a p electrode 165. The LED 160 of the stretchable display device 100 according to the embodiment of the present disclosure has a flip-chip structure in which the n electrode 164 and the p electrode 165 are formed on one surface.

The n-type layer 161 may be formed by injecting an n-type impurity into gallium nitride (GaN) having excellent crystallinity. The n-type layer 161 may be disposed on a separate base substrate which is formed of a material which is capable of emitting light.

The active layer 162 is disposed on the n-type layer 161. The active layer 162 is a light emitting layer which emits light in the LED 160 and may be formed of a nitride semiconductor, for example, indium gallium nitride (InGaN). The p-type layer 163 is disposed on the active layer 162. The p-type layer 163 may be formed by injecting a p-type impurity into gallium nitride (GaN).

As described above, the LED 160 according to the embodiment of the present disclosure may be manufactured by sequentially laminating the n-type layer 161, the active layer 162, and the p-type layer 163, and then etching a predetermined part to form the n electrode 164 and the p electrode 165. In this case, the predetermined part which is a space for separating the n electrode 164 and the p electrode 165 from each other may be etched to expose a part of the n-type layer 161. In other words, the surface of the LED 160 on which the n electrode 164 and the p electrode 165 are disposed are not flat surfaces but have different heights.

As described above, in the etched area, in other words, on the n-type layer 161 exposed by the etching process, the n electrode 164 is disposed. The n electrode 164 may be formed of a conductive material. In the meantime, in an area which is not etched, in other words, on the p-type layer 163, the p electrode 165 is disposed. The p electrode 165 is also formed of a conductive material, for example, and may be formed of the same or substantially the same material as the n electrode 164.

An adhesive layer AD is disposed on top surfaces of the first connection pad 191 and the second connection pad 192 and between the first connection pad 191 and the second connection pad 192 so that the LED 160 may be bonded onto the first connection pad 191 and the second connection pad 192. In this case, the n electrode 164 may be disposed on the second connection pad 192 and the p electrode 165 may be disposed on the first connection pad 191.

The adhesive layer AD may be a conductive adhesive layer in which conductive balls are dispersed in an insulating base member. Therefore, when heat or pressure is applied to the adhesive layer AD, the conductive balls are electrically connected in a portion applied with heat or pressure to have a conductive property and an area which is not pressurized may have an insulating property. For example, the n electrode 164 is electrically connected to the second connection line CNL2 by means of the adhesive layer AD and the p electrode 165 is electrically connected to the first connection line CNL1 by means of the adhesive layer AD. That is, after applying the adhesive layer AD on the first connection pad 191 and the second connection pad 192 using an inkjet method or the like, the LED 160 is transferred onto the adhesive layer AD and the LED 160 is pressurized and heated. By doing this, the first connection pad 191 may be electrically connected to the p electrode 165, and the second connection pad 192 may be electrically connected to the n electrode 164. However, another part of the adhesive layer AD excluding a part of the adhesive layer AD disposed between the n electrode 164 and the second connection pad 192 and a part of the adhesive layer AD disposed between the p electrode 165 and the first connection pad 191 has an insulating property. In the meantime, the adhesive layer AD may be divided to be disposed on the first connection pad 191 and the second connection pad 192, respectively.

As described above, the stretchable display device 100 according to the embodiment of the present disclosure has a structure in which the LED 160 is disposed on the lower stretching substrate 110a on which the transistor 150 is disposed. Therefore, when the stretchable display device 100 is turned on, different voltage levels which are applied to the first connection pad 191 and the second connection pad 192 are transmitted to the n electrode 164 and the p electrode 165 so that the LED 160 emits light.

Referring to FIG. 3, the upper stretching substrate 110b is disposed on the bank 116, the LED 160, and the lower stretching substrate 110a.

The upper stretching substrate 110b is a substrate which supports various components disposed below the upper stretching substrate 110b. Specifically, the upper stretching substrate 110b is formed by coating a material which constitutes the upper stretching substrate 110b on the lower stretching substrate 110a and the first substrate 111 and then curing the material to be disposed to be in contact with the lower stretching substrate 110a, the first substrate 111, the second substrate 120, and the connection line CNL.

The upper stretching substrate 110b which is a soft substrate may be configured by an insulating material which is bendable or extendable. The upper stretching substrate 110b is a soft substrate so as to be reversibly expanded and contracted. Further, an elastic modulus of the upper stretching substrate may be several MPa to several hundreds of MPa and an extension rupture ratio may be 100% or higher. A thickness of the upper stretching substrate 110b may be 10 µm to 1 mm but is not limited thereto.

The upper stretching substrate 110b may be formed of the same or substantially the same material as the lower stretching substrate 110a. For example, the upper stretching substrate 110b may be formed of a silicon rubber such as polydimethylsiloxane (PDMS) or an elastomer such as polyurethane (PU) or polytetrafluoroethylene (PTFE) and thus have a flexible property. However, the material of the upper stretching substrate 110b is not limited thereto.

Even though not illustrated in FIG. 3, a polarization layer may be disposed on the upper stretching substrate 110b. The polarization layer may perform a function which polarizes light incident from the outside of the stretchable display device 100 to reduce the external light reflection. Further, an optical film other than the polarization layer may be disposed on the upper stretching substrate 110b.

In the stretchable display device of the related art, the planarization layer which is formed of an organic insulating material is disposed on a plurality of inorganic insulating layers, such as a buffer layer, a gate insulating layer, and an interlayer insulating layer, without covering side surfaces of the plurality of inorganic insulating layers. Therefore, the connection line is disposed so as to be in contact with the side surfaces of the plurality of inorganic insulating layers. However, if a patterning process, that is, an etching process is performed on the plurality of inorganic insulating layers, steps of the side portions of the plurality of inorganic insulating layers may be caused. That is, a slope of the side surfaces of the plurality of inorganic insulating layers formed by the etching process is very steep so that when the connection line is directly formed on the side portions of the plurality of inorganic insulating layers, disconnection of the connection line may be caused.

Therefore, in the stretchable display device 100 according to the embodiment of the present disclosure, the planarization layer 115 is disposed to cover the side surfaces of the buffer layer 112, the gate insulating layer 113, and the interlayer insulating layer 114. By doing this, when the stretchable display device 100 is repeatedly stretched, the separation of the connection line CNL from the side portions of the planarization layer 115 and the plurality of inorganic insulating layers may be reduced. To be more specific, the connection line CNL which is formed of copper or other metal materials having a low resistance is disposed on a top surface and a side surface of the planarization layer 115 which is formed of an organic insulating material so that the adhesive strength of the lower portion of the connection line CNL may be improved. Accordingly, in the stretchable display device 100 according to the embodiment of the present disclosure, the planarization layer 115 is disposed to cover the side surfaces of the plurality of inorganic insulating layers on the first substrate 111, such as the buffer layer 112, the gate insulating layer 113, and the interlayer insulating layer 114. By doing this, when the stretchable display device 100 is repeatedly stretched, the separation of the connection line CNL from the planarization layer 115 is reduced so that the reliability of the stretchable display device 100 may be improved. Further, in the stretchable display device 100 according to the embodiment of the present disclosure, the planarization layer 115 is disposed to cover the side surfaces of the plurality of inorganic insulating layers between the first substrate 111 and the planarization layer 112, such as the buffer layer 112, the gate insulating layer 113, and the interlayer insulating layer 114. By doing this, steps of the side surfaces of the buffer layer 112, the gate insulating layer 113, and the interlayer insulating layer 114 may be compensated. That is, the planarization layer 115 is disposed to cover the top surfaces and the side surfaces of the buffer layer 112, the gate insulating layer 113, and the interlayer insulating layer 114, and an inclination angle of the side surface of the planarization layer 115 may be smaller than an inclination angle formed by the side surfaces of the buffer layer 112, the gate insulating layer 113, and the interlayer insulating layer 114. That is, the side surface of the planarization layer 115 may have a slope which is gentler than a slope formed by a side surface of the interlayer insulating layer 114, a side surface of the gate insulating layer 113, and a side surface of the buffer layer 112. Therefore, the connection line CNL which is disposed to be in contact with the side surface of the planarization layer 115 is disposed to have a gentle slope so that the crack generated in the connection line CNL when the connection line CNL is formed may be reduced. Further, when the stretchable display device 100 is stretched, the stress generated in the connection line CNL is reduced and the crack of the connection line CNL or the separation of the connection line CNL from the side surface of the planarization layer 115 may be suppressed.

Further, in the stretchable display device 100 according to the embodiment of the present disclosure, the connection line CNL has the same or substantially the same shape as the shape of the second substrate 120 and thus has a sine wave shape. Therefore, as compared with the connection line CNL having a straight line shape, the resistance of the connection line CNL may be increased. As a result, among various metal materials which may be used for a wiring line to lower the resistance of the connection line CNL, copper (Cu) having a low resistance characteristic may be used for the connection line CNL. However, when copper (Cu) or other metal materials having low resistance are formed on the inorganic insulating layer which is formed of an inorganic insulating material, there may be an adhesive strength issue with the inorganic insulating layer. That is, copper (Cu) or other metal materials having a low resistance has a low adhesive strength with the inorganic insulating layer. Therefore, when the connection line CNL is disposed to be in contact with the side portion of the plurality of inorganic insulating layers such as the buffer layer 112, the gate insulating layer 113, and the interlayer insulating layer 114, if the stretchable display device 100 is stretched, the connection line CNL is separated from the side surfaces of the buffer layer 112, the gate insulating layer 113, and the interlayer insulating layer 114. Therefore, the reliability of the stretchable display device 100 may be lowered.

Further, in the stretchable display device 100 according to the embodiment of the present disclosure, the planarization layer 115 is disposed on the plurality of inorganic insulating layers, such as the buffer layer 112, the gate insulating layer 113, and the interlayer insulating layer 114, and the transistor 150. By doing this, during the transferring process of the LED 160, the components disposed below the planarization layer 115 may be protected. When the LED 160 is disposed in the stretchable display device 100, the LED may be disposed by pressurizing the LED 160 above the stretchable display device 100. In this case, the transistor 150, various wiring lines, and the connection line CNL disposed below the LED 160 may be damaged due to the pressure. Accordingly, the planarization layer 115 is disposed on the buffer layer 112, the gate insulating layer 113, the interlayer insulating layer 114, and the transistor 150 so that when the LED 160 is transferred, the stress due to the pressurization may be alleviated. Consequently, the damages of the transistor 150, various wiring lines, and the connection line CNL disposed below the planarization layer 115 may be reduced.

Stretching Structure

Figure 4:
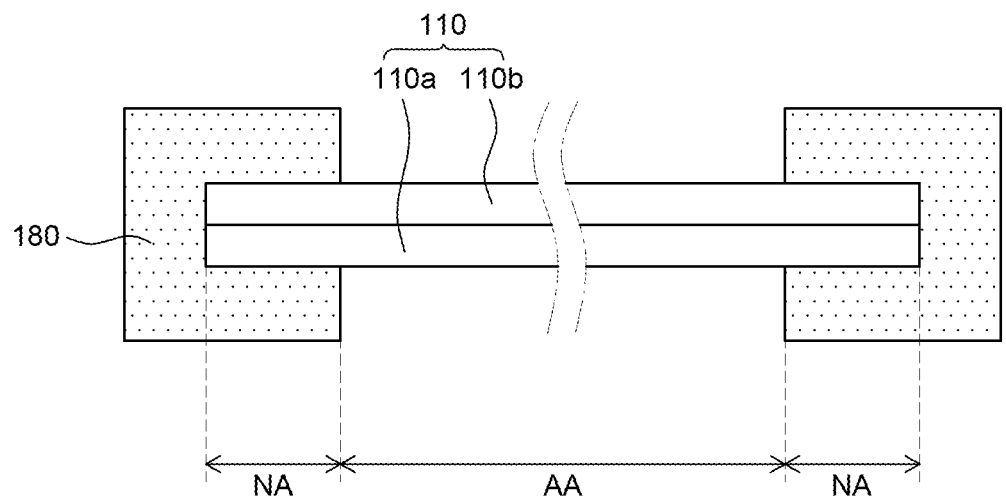
FIG. 4 is a cross-sectional view taken along the line IV-IV' of FIG. 1.

FIG. 4 is a cross-sectional view taken along the line IV-IV' of FIG. 1. In FIG. 4, for the convenience of illustration, components such as the plurality of first substrates 111 and the plurality of third substrates 121 disposed on the lower stretching substrate 110a are not illustrated. For the convenience of description, the description will be made also with reference to FIG. 1.

Referring to FIG. 4, the frame 180 is disposed in the non-display area NA of the substrate structure 110. That is, the frame 180 is disposed in the non-display areas NA disposed at a left side and a right side of the display area AA of the substrate structure 110 with respect to the X-axis direction. As described above, even though in FIG. 4, it is illustrated that the frame 180 is disposed in the entire non-display area NA of the substrate structure 110, it is not limited thereto and the frame 180 may be disposed in a portion of non-display area NA.

Further, the frame 180 may be disposed to enclose the substrate structure 110 in the non-display area NA. For example, the frame 180 may be disposed to be in direct contact with the top surface, the side surface, and the bottom surface of the substrate structure 110 in the non-display area NA. In this case, the frame 180 may be disposed so as to enclose at least a part of the top surface of the substrate structure 110 and at least a part of the bottom surface.

The frame 180 may be fixed to the substrate structure 110 by means of a separate fixing member, but it is not limited thereto. The frame 180 may be attached to the substrate structure 110 by a surface processing process such as $O_2$ plasma.

In the meantime, the frame 180 has a modulus higher than that of the substrate structure 110. That is, the modulus of the frame 180 may be formed to be higher than the moduli of the upper stretching substrate 110b and the lower stretching substrate 110a. For example, the modulus of the frame 180 may be two or more times higher than the modulus of the substrate structure 110 but is not limited thereto.

Therefore, when the stretchable display device 100 is stretched, the contraction generated in a part of the substrate structure 110 in a direction perpendicular to the stretching direction may be reduced.

With regard to this, the frame 180 may be formed of the same or substantially the same material as the substrate structure 110. For example, the frame 180 may be formed of a silicon rubber such as polydimethylsiloxane (PDMS) or an elastomer such as polyurethane (PU) or polytetrafluoroethylene (PTFE), but is not limited thereto. The frame 180 may be formed of a different material from the substrate structure 110.

The frame 180 is formed of the same or substantially the same material as the substrate structure 110 and a degree of polymerization of the frame 180 may be higher than a degree of polymerization of the substrate structure 110. The degree of polymerization means repeated units constituting the polymer material, and the higher the degree of polymerization, the higher the viscosity of the polymer material.

The modulus of the frame 180 may be increased by adjusting a degree of polymerization of a material which constitutes the frame 180. For example, when both the frame 180 and the substrate structure 110 are formed of polydimethylsiloxane (PDMS), the degree of polymerization of polydimethylsiloxane which constitutes the frame 180 may be adjusted to be higher than the degree of polymerization of polydimethylsiloxane which constitutes the substrate structure 110. Therefore, the modulus of the frame 180 may be adjusted to be higher than the modulus of the substrate structure 110. In this case, the degree of polymerization of the material which constitutes the frame 180 may be two or more times higher than the degree of polymerization of the material which constitutes the substrate structure 110 but is not limited thereto.

In the meantime, even though it is not illustrated in FIG. 4, the pigment may be dispersed in the frame 180. The frame 180 in which the pigment is dispersed is disposed to cover the non-display area NA of the substrate structure 110 to reduce the reflection in the non-display area NA which is an outer peripheral portion of the substrate structure 110.

For example, a black pigment may be dispersed in the frame 180. By doing this, the reflectance of the non-display area NA is reduced to reduce external light reflection of the non-display area NA. As a result, the image displayed in the display area AA is not affected by the external light so that the image quality of the stretchable display device 100 may be improved.

Further, even though it is not illustrated in FIG. 4, the frame 180 may include hygroscopic particles. That is, the frame 180 includes hygroscopic particles such as getter so that moisture or oxygen which flows in the stretchable display device 100 may be reduced. Therefore, the reliability of the stretchable display device 100 may be improved.

In the stretchable display device of the related art, when the stretchable display device is stretched, the substrate structure may be contracted in a direction perpendicular to the stretching direction. For example, when the stretchable display device extends in the Y-axis direction, the substrate structure may be contracted in the X-axis direction due to the Poisson's effect. Therefore, a stress is generated in the connection line which is disposed in an area where the substrate structure is contracted so that the connection line may be cracked or disconnected.

However, in the stretchable display device 100 according to the embodiment of the present disclosure, the frame 180 is disposed on a first side surface and a second side surface of the substrate structure 110. Therefore, when the stretchable display device 100 is stretched, the contraction of the substrate structure 110 in a direction perpendicular to the stretching direction may be reduced. The frame 180 is formed to have a modulus higher than that of the substrate structure 110 so that the frame 180 may be less elastic than the substrate structure 110. That is, when the stretchable display device 100 is stretched, the frame 180 is stretched less than the substrate structure 110 so that the force of the substrate structure 110 which is contracted in the direction perpendicular to the stretching direction may be reduced.

For example, when the stretchable display device 100 is stretched in the Y-axis direction, the substrate structure 110 may be contracted in the X-axis direction. In this case, the frame 180 is disposed on the first side surface and the second side surface which are both side surfaces of the X-axis direction of the substrate structure 110 to reduce the contraction of the substrate structure 110 in the X-axis direction. Therefore, the frame 180 is disposed on the first side surface and the second side surface of the substrate structure 110 to reduce the contraction of the substrate structure 110. By doing this, the damage of the connection line CNL disposed in an area where the substrate structure 110 is contracted may be reduced and distortion of the display area AA of the stretchable display device 100 may be reduced.

Frame Disposed on Side Surface of Substrate Structure

Figure 5:
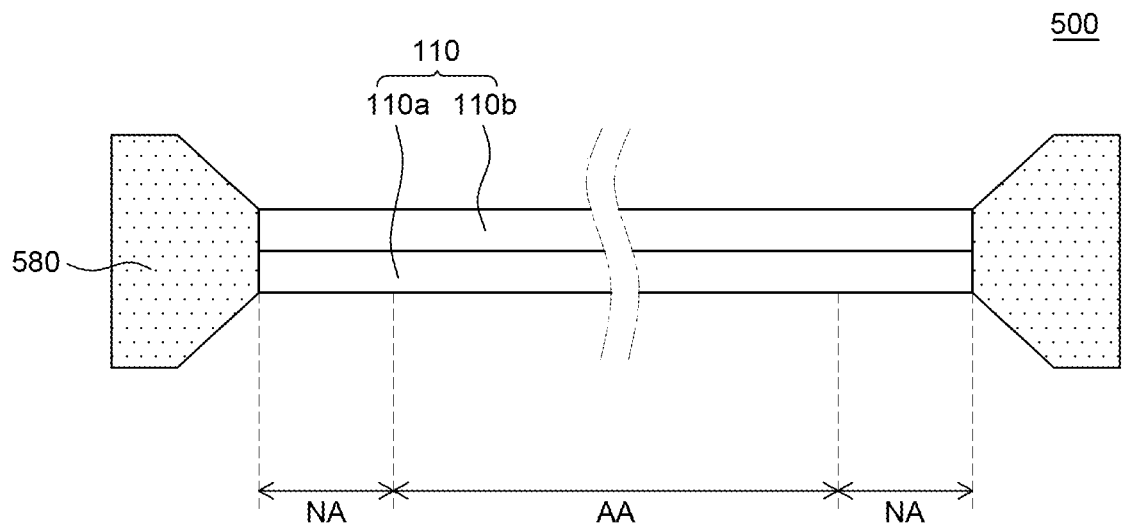
FIG. 5 is a cross-sectional view of a stretchable display device according to another embodiment of the present disclosure.

FIG. 5 is a cross-sectional view of a stretchable display device according to another embodiment of the present disclosure. The only difference between a stretchable display device 500 of FIG. 5 and the stretchable display device 100 of FIGS. 1 to 4 is a frame 580, but other configurations are substantially the same, so that a redundant description will be omitted.

Referring to FIG. 5, the frame 580 is disposed to be in contact with the side surface of the substrate structure 110. The frame 580 is disposed to be in contact only with the first side surface and the second side surface which are both side surfaces of the substrate structure 110 to be fixed to the substrate structure 110. In this case, a thickness of the frame 580 may be increased as the distance from the side surface of the substrate structure 110 is increased. For example, the thickness of the frame 580 may be the same or substantially the same as the thickness of the substrate structure 110 in a surface which is in contact with the first side surface and the second side surface of the substrate structure 110 and the thickness of the frame 580 may be increased as the distance from the substrate structure 110 is increased. Therefore, when the stretchable display device 500 is stretched, the frame 580 may reduce the contraction generated in the substrate structure 110.

In the stretchable display device 500 according to another embodiment of the present disclosure, the thickness of the frame 580 is formed to be increased as the distance from the side surface of the substrate structure 110 is increased. Therefore, the elasticity of the frame 580 may be relatively lowered and the hardness thereof may be increased. Accordingly, when the stretchable display device 500 is stretched, the deformation of the substrate structure 110 is reduced or minimized to maintain a predetermined shape.

In other words, when the stretchable display device 500 according to another embodiment of the present disclosure is stretched, a strain rate of the frame is lowered so that the contraction of the substrate structure 110 may be reduced. Therefore, the thickness of the frame 580 is increased as the distance from the side surface of the substrate structure 110 is increased so that when the stretchable display device 500 is stretched, the substrate structure 110 is not deformed. Therefore, the stretching reliability may be improved.

Plurality of Sub Frames

Figure 6:
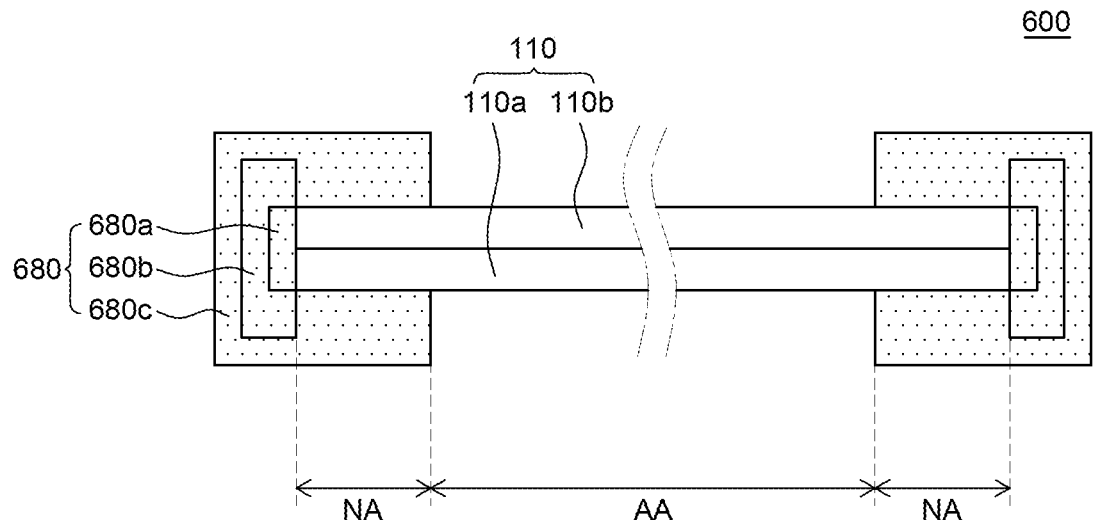
FIG. 6 is a cross-sectional view of a stretchable display device according to still another embodiment of the present disclosure.

FIG. 6 is a cross-sectional view of a stretchable display device according to still another embodiment of the present disclosure. The only difference between a stretchable display device 600 of FIG. 6 and the stretchable display device 100 of FIGS. 1 to 4 is a frame 680, but other configurations are substantially the same, so that a redundant description will be omitted.

Referring to FIG. 6, the frame 680 includes a plurality of sub frames 680a, 680b, and 680c. The plurality of sub frames 680a, 680b, and 680c is configured by a first sub frame 680a, a second sub frame 680b, and a third sub frame 680c to be sequentially laminated on the side surface of the substrate structure 110.

For example, the first sub frame 680a may be disposed so as to be in contact with the side surface of the substrate structure 110.

The second sub frame 680b is disposed to enclose the first sub frame 680a to be disposed so as to be in contact with a top surface, a bottom surface, and a side surface of the first sub frame 680a.

Further, the third sub frame 680c is disposed to enclose the second sub frame 680b to be disposed so as to be in contact with a top surface, a bottom surface, and a side surface of the second sub frame 680b. The third sub frame 680c may be disposed so as to be in contact with the top surface and the bottom surface of the substrate structure 110.

Even though in FIG. 6, the first sub frame 680a and the second sub frame 680b are not in contact with the top surface and the bottom surface of the substrate structure 110, they are not limited thereto. Therefore, the first sub frame 680a and the second sub frame 680b may be disposed to be in contact with the top surface or the bottom surface of the substrate structure 110.

Further, even though in FIG. 6, three sub frames 680a, 680b, and 680c are illustrated, the number of the sub frames is not limited thereto and the number of the plurality of sub frames may be changed to three or more or three or less depending on the design.

The modulus of each of the plurality of sub frames 680a, 680b, and 680c may be increased as the distance from the substrate structure 110 is increased.

For example, a modulus of the second sub frame 680b may be higher than a modulus of the first sub frame 680a and a modulus of the third sub frame 680c may be higher than a modulus of the second sub frame 680b. Further, the modulus of the first sub frame 680a may be higher than the modulus of the substrate structure 110. Therefore, the moduli of the substrate 110, the first sub frame 680a, the second sub frame 680b, the third sub frame 680c may be increased in this order.

The plurality of sub frames 680a, 680b, and 680c may be formed of the same or substantially the same material. When the plurality of sub frames 680a, 680b, and 680c is formed of the same or substantially the same material, the degree of polymerization of each sub frame 680 is adjusted to adjust a modulus of each of the plurality of sub frames 680a, 680b, and 680c.

For example, the degree of polymerization of the second sub frame 680b is adjusted to be higher than the degree of polymerization of the first sub frame 680a to adjust the modulus of the second sub frame 680b to be higher than the modulus of the first sub frame 680a. Further, the degree of polymerization of the third sub frame 680c is adjusted to be higher than the degree of polymerization of the second sub frame 680b to adjust the modulus of the third sub frame 680c to be higher than the modulus of the second sub frame 680b.

However, they are not limited thereto and the plurality of sub frames 680a, 680b, and 680c may be formed of different materials.

In the stretchable display device 600 according to still another embodiment of the present disclosure, the frame 680 includes the plurality of sub frames 680a, 680b, and 680c. Therefore, when the stretchable display device 600 is stretched, the stress generated between the frame 680 and the non-display area NA of the substrate structure 110 may be reduced.

The frame 680 includes a plurality of sub frames 680a, 680b, and 680c and the modulus of the plurality of sub frames 680a, 680b, and 680c may be increased as the distance from the substrate structure 110 is increased. Therefore, the plurality of sub frames 680 disperses the stress between the frame 680 and the non-display area NA of the substrate structure 110 where the frame 680 is disposed due to the difference of the moduli of the frame 680 and the substrate structure 110. Therefore, when the stretchable display device is stretched, the damage of the frame 680 or the substrate structure 110 may be suppressed.

Accordingly, the frame 680 is configured by the plurality of sub frames 680a, 680b, and 680c and the moduli of the plurality of sub frames 680a, 680b, and 680c are increased as the distance from the side surface of the substrate structure 110 is increased. Therefore, the damage generated between the frame 680 and the non-display area NA of the substrate structure 110 is reduced or minimized to improve the reliability for stretching.

Adhesive Member

Figure 7:
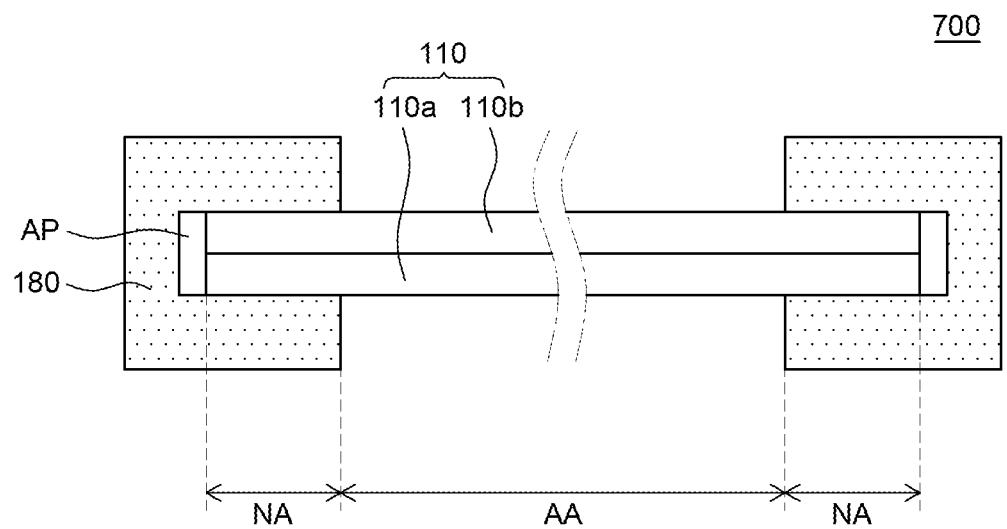
FIG. 7 is a cross-sectional view of a stretchable display device according to still another embodiment of the present disclosure.

FIG. 7 is a cross-sectional view of a stretchable display device according to still another embodiment of the present disclosure. The only difference between a stretchable display device 700 of FIG. 7 and the stretchable display device 100 of FIGS. 1 to 4 is that an adhesive member AP is added, but other configurations are substantially the same, so that a redundant description will be omitted.

Referring to FIG. 7, an adhesive member AP may be disposed between the frame 180 and a side surface of the substrate structure 110. The adhesive member AP is formed to have the same or substantially the same thickness as the substrate structure 110 to be disposed to be in contact with the side surface of the substrate structure 110.

Even though in FIG. 7, it is illustrated that the adhesive member AP is disposed to be in contact only with the side surface of the substrate structure 110, it is not limited thereto. The adhesive member AP may be disposed to be in contact with a part of the top surface or a part of the bottom surface of the substrate structure 110 of the non-display area NA.

In the stretchable display device 700 according to still another embodiment of the present disclosure, the adhesive member AP is disposed between the frame 180 and the side surface of the substrate structure 110 to increase adhesiveness between the frame 180 and the substrate structure 110.

For example, when the frame 180 is formed to be fastened with the side surface of the substrate structure 110, the adhesiveness between the frame 180 and the substrate structure 110 may be relatively low. Accordingly, when the stretchable display device 700 is stretched, it may be difficult to reduce the separation of the frame 180 from the side surface of the substrate structure 110 or contraction of the substrate structure 110.

As a result, the adhesive member AP is disposed between the frame 180 and the side surface of the substrate structure 110 to increase adhesiveness between the frame 180 and the substrate structure 110. Accordingly, when the stretchable display device 700 is stretched, the frame 180 may be firmly fixed to the substrate structure 110 and contraction of the substrate structure 110 may be reduced.

As a result, the adhesive member AP is disposed between the frame 180 and the side surface of the substrate structure 110, so that the stretching reliability of the stretchable display device 700 may be improved.

Arrangement of Frame

Figure 8:
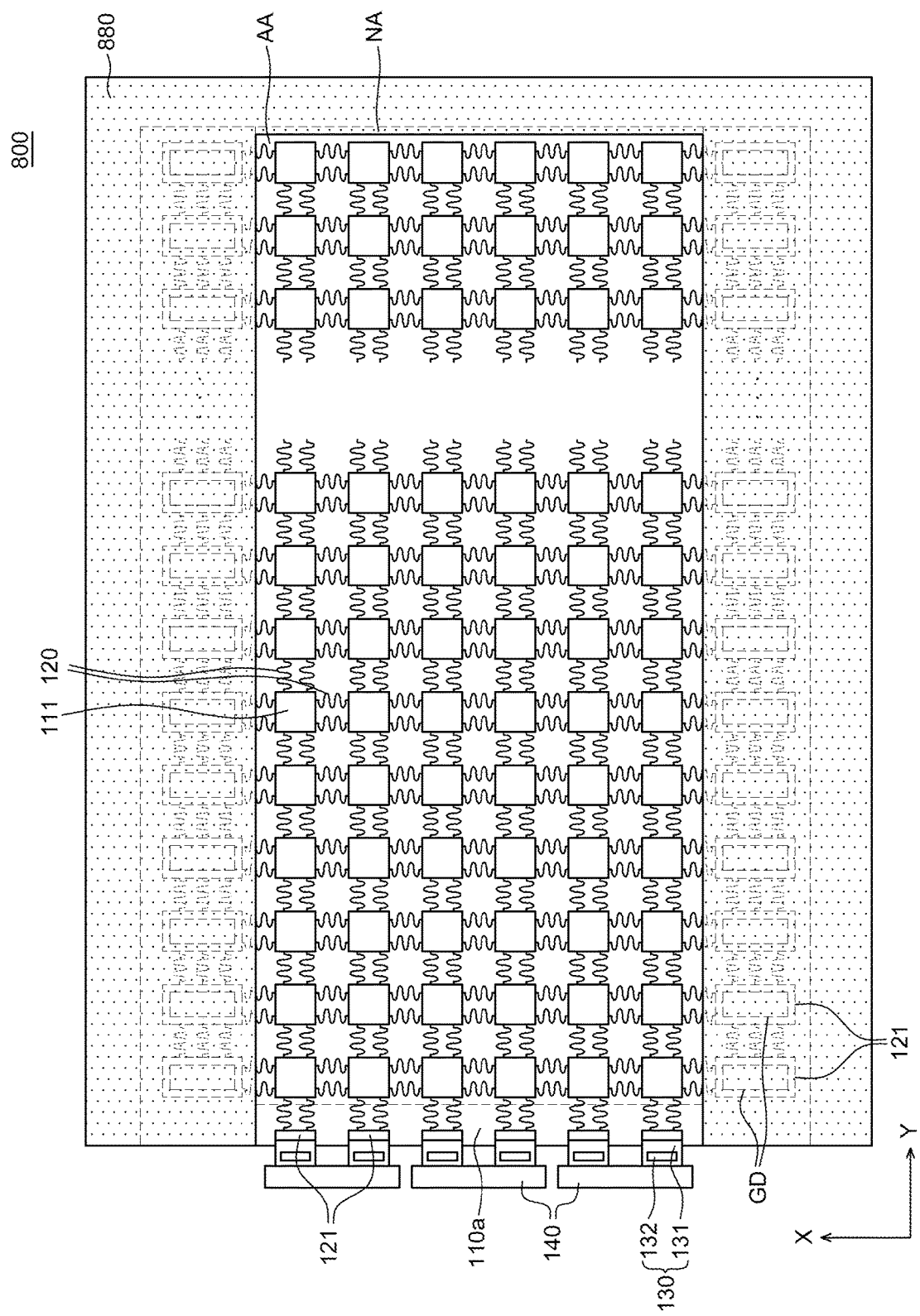
FIG. 8 is a plan view of a stretchable display device according to still another embodiment of the present disclosure.

FIG. 8 is a plan view of a stretchable display device according to still another embodiment of the present disclosure. The only difference between a stretchable display device 800 of FIG. 8 and the stretchable display device 100 of FIGS. 1 to 4 is a shape of a frame 880, but other configurations are substantially the same, so that a redundant description will be omitted.

Referring to FIG. 8, the substrate structure 110 may include a third side surface and a fourth side surface disposed between a first side surface and a second side surface. For example, the first side surface and the second surface are disposed at a left side and a right side of the substrate structure 110 with respect to the X-axis direction, respectively, and the third side surface and the fourth side surface may be disposed on an upper side or a lower side of the substrate structure 110 with respect to the Y-axis direction.

Referring to FIG. 8, the frame 880 may be disposed not only to cover the first side surface and the second side surface of the substrate structure 110, but also to cover any one of the third side surface and the fourth side surface of the substrate structure 110. For example, as illustrated in FIG. 8, the frame 880 may be disposed on both side surfaces of the substrate structure 110 with respect to an X-axis direction to include a part extending in the Y-axis direction. The frame 880 is disposed at the lower side of the substrate structure 110 with respect to the Y-axis direction to further include a part extending in the X-axis direction. Therefore, the frame 880 may be formed to have a "U" shape as a whole.

In the meantime, when the frame 880 is disposed on the third side surface of the substrate structure 110, the COF 130 may be bonded to the non-display area NA of the substrate structure 110 which is adjacent to the fourth side surface which is opposite to the third side surface. Further, the frame 880 may also be disposed in a part of the non-display area NA which is adjacent to the fourth side surface of the substrate structure 110 where the COF 130 is disposed. That is, the frame 880 may be disposed on both the third side surface and the fourth side surface of the substrate structure 110.

In the stretchable display device 800 according to still another embodiment of the present disclosure, the frame 880 is disposed on the third side surface or the fourth side surface between the first side surface and the second side surface, among the plurality of side surfaces of the substrate structure 110. Therefore, the substrate structure 110 may have a relatively higher rigidity on the third side surface or the fourth side surface.

For example, when the third side surface of the substrate structure 110 is defined as a lower side surface of the substrate structure 110 with respect to the Y-axis direction, the frame 880 may be disposed to cover the lower side surface of the substrate structure 110. In this case, the frame 880 may be formed to have a modulus higher than the modulus of the substrate structure 110 so that the elasticity may be lower than that of the substrate structure 110 and the hardness may be higher than that of the substrate structure 110. Therefore, the frame 880 may be disposed to cover the third side surface of the substrate structure 110 so that the substrate structure 110 may have a relatively higher rigidity on the third side surface.

Accordingly, the frame 880 may allow the substrate structure 110 to have a high rigidity not only on the first side surface and the second side surface, but also on the third side surface or the fourth side surface. As a result, the frame 880 may protect the side surfaces of the substrate structure 110.

The embodiments of the present disclosure can also be described as follows:

According to an aspect of the present disclosure, a stretchable display device includes a substrate structure which defines a display area where images are displayed and a non-display area adjacent to the display area and includes an upper stretching substrate and a lower stretching substrate; and a frame which is disposed to cover a first side surface and a second side surface opposite to the first side surface, among a plurality of side surfaces of the substrate structure, in which a modulus of the frame is higher than moduli of the upper stretching substrate and the lower stretching substrate.

The frame may be disposed so as to enclose at least a part of a top surface and at least a part of a bottom surface of the substrate structure in the non-display area.

The frame may be in direct contact with a top surface, a bottom surface, and a side surface of the substrate structure.

A pigment may be dispersed in the frame.

The stretchable display device may further comprise an adhesive member disposed between the frame and a side surface of the substrate structure.

The frame may include a plurality of sub frames which is laminated on a side surface of the substrate structure and a modulus of each of the plurality of sub frames is increased as a distance from the substrate structure is increased.

The frame may include hygroscopic particles.

The frame and the substrate structure may be formed of the same or substantially the same material and a degree of polymerization of the frame is higher than a degree of polymerization of the substrate structure.

The frame may be disposed to be in contact with the side surface of the substrate structure.

A thickness of the frame may be increased as a distance from the side surface of the substrate structure is increased.

The substrate structure may further include a third side surface and a fourth side surface between the first side surface and the second side surface among the plurality of side surfaces and the frame may be disposed to further cover only one side surface of the third side surface and the fourth side surface.

The stretchable display device may further comprise a flexible film which is disposed in the non-display area which is adjacent to the other one of the third side surface and the fourth side surface.

According to another aspect of the present disclosure, a stretchable display device includes a stretching substrate structure which defines a display area in which a plurality of pixels is defined and a non-display area disposed to enclose the display area and includes a first stretching substrate and a second stretching substrate; and a frame which is disposed to be in contact with at least one of a top surface, a bottom surface, and a side surface of the stretching substrate structure, the frame may have a rigidity higher than that of the first stretching substrate and the second stretching substrate.

The frame may be disposed on one side surface of the stretching substrate structure and the other side surface which is opposite to the one side surface.

The frame is disposed to be in contact with a top surface, a bottom surface, and a side surface of the stretching substrate structure.

The frame may include a first sub frame to a third sub frame, the third sub frame is disposed so as to enclose the second sub frame, and the second sub frame is disposed so as to enclose the first sub frame.

A rigidity of each of the first sub frame to the third sub frame may be increased as the distance from the stretching substrate structure is increased.

The frame and the stretching substrate structure may be formed of the same or substantially the same material and a degree of polymerization of the frame is higher than a degree of polymerization of the substrate structure.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A stretchable display device, comprising:
    a substrate structure that includes an upper stretchable substrate and a lower stretchable substrate, the substrate structure having thereon a display area having a plurality of sub-pixels disposed therein from which images are displayed and a non-display area adjacent to the display area, wherein the substrate structure includes a plurality of side surfaces; and
    a frame covering a first side surface and a second side surface opposite to the first side surface, among the plurality of side surfaces of the substrate structure,
    a flexible film on which components configured to supply signals to the plurality of sub pixels that are disposed in the display area;
    wherein a modulus of the frame is higher than moduli of each of the upper stretchable substrate and the lower stretchable substrate,
    wherein the plurality of side surfaces of the substrate structure further includes a third side surface and a fourth side surface, the third side surface and the fourth side surface being between the first side surface and the second side surface,
    wherein the frame is disposed to further cover only one side surface of either the third side surface or the fourth side surface, and
    wherein the flexible film which is disposed in the non-display area which is adjacent to the other one of either the third side surface or the fourth side surface not covered by the frame.

2. The stretchable display device according to claim 1, wherein the substrate structure further includes a top surface and a bottom surface, the frame encloses at least a part of the top surface and at least a part of the bottom surface of the substrate structure in the non-display area.

3. The stretchable display device according to claim 2, wherein the frame is in direct contact with the top surface, the bottom surface, and a side surface of the substrate structure.

4. The stretchable display device according to claim 2, wherein a pigment is dispersed in the frame.

5. The stretchable display device according to claim 2, further comprising:
    an adhesive member disposed between the frame and a side surface of the substrate structure.

6. The stretchable display device according to claim 1, wherein the frame includes a plurality of sub frames which is laminated on a side surface of the substrate structure and
    a modulus of each of the plurality of sub frames is increased as a distance from the substrate structure is increased.

7. The stretchable display device according to claim 1, wherein the frame includes hygroscopic particles.

8. The stretchable display device according to claim 1, wherein the frame and the substrate structure are formed of the same or substantially the same material and
    a degree of polymerization of the frame is higher than a degree of polymerization of the substrate structure.

9. The stretchable display device according to claim 1, wherein the frame is in contact with the side surface of the substrate structure.

10. The stretchable display device according to claim 9, wherein a thickness of the frame is increased as a distance from the side surface of the substrate structure is increased.

11. A display device, comprising:
    a stretchable substrate structure that includes a first stretchable substrate and a second stretchable substrate, the stretchable substrate structure having thereon a display area in which a plurality of pixels is formed and a non-display area disposed to enclose the display area, the stretchable substrate structure having a top surface, a bottom surface, and a side surface; and a frame contacting with at least one of the top surface, the bottom surface, and the side surface of the stretchable substrate structure, wherein the frame has a rigidity higher than that of each of the first stretchable substrate and the second stretchable substrate, wherein the frame includes a first sub frame, a second sub frame, and a third sub frame, wherein the first sub frame is disposed so as to be in contact with the side surface of the substrate structure, wherein the second sub frame is disposed so as to be in contact with a top surface, a bottom surface, and a side surface of the first sub frame, wherein the third sub frame is disposed so as to be in contact with a top surface, a bottom surface, and a side surface of the second sub frame, and wherein the third sub frame is disposed so as to be in contact with the top surface and the bottom surface of the substrate structure.

12. The display device according to claim 11, wherein the frame is disposed on one side surface of the stretchable substrate structure and the other side surface which is opposite to the one side surface.

13. The display device according to claim 12, wherein the frame is in contact with the top surface, the bottom surface, and the side surface of the stretchable substrate structure.

14. The display device according to claim 11, wherein a rigidity of each of the first sub frame to the third sub frame is increased as the distance from the stretchable substrate structure is increased.

15. The display device according to claim 11, wherein the frame and the stretchable substrate structure are formed of the same or substantially the same material, and a degree of polymerization of the frame is higher than a degree of polymerization of the stretchable substrate structure.

* * * * *